(12) United States Patent
McCamy et al.

(10) Patent No.: US 8,557,328 B2
(45) Date of Patent: Oct. 15, 2013

(54) NON-ORTHOGONAL COATER GEOMETRY FOR IMPROVED COATINGS ON A SUBSTRATE

(75) Inventors: James W. McCamy, Export, PA (US); John F. Sopko, Trafford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 995 days.

(21) Appl. No.: 12/572,317

(22) Filed: Oct. 2, 2009

(65) Prior Publication Data

US 2011/0081486 A1 Apr. 7, 2011

(51) Int. Cl.
C23C 16/448 (2006.01)
C23C 16/40 (2006.01)

(52) U.S. Cl.
USPC ............... 427/126.3; 427/255.19; 428/432; 428/702

(58) Field of Classification Search
USPC ............. 428/432, 702; 118/718; 252/520.21; 427/126.3, 255.19
See application file for complete search history.

(56) References Cited

U.S. PATENT DOCUMENTS

| | | | |
|---|---|---|---|
| 3,282,243 A | 11/1966 | Phillips, Jr. et al. | |
| 3,333,936 A | 8/1967 | Warren | |
| 3,674,453 A | 7/1972 | Loukes et al. | |
| 4,188,199 A | 2/1980 | Van Laethem et al. | |
| 4,402,722 A | 9/1983 | Edge | |
| 4,584,206 A | 4/1986 | Sleighter | |
| 4,853,257 A | 8/1989 | Henery | |
| 4,900,110 A | 2/1990 | Sleighter | |
| 4,928,627 A | 5/1990 | Lindner | |
| 5,228,949 A * | 7/1993 | Ketelhohn et al. | 216/92 |
| 5,356,718 A | 10/1994 | Athey et al. | |
| 5,378,308 A * | 1/1995 | Thoms | 216/92 |
| 5,599,387 A | 2/1997 | Neuman et al. | |
| 5,863,337 A | 1/1999 | Neuman et al. | |
| 6,112,554 A | 9/2000 | Terneu et al. | |
| 6,918,989 B2 * | 7/2005 | Higa | 156/345.21 |

FOREIGN PATENT DOCUMENTS

EP 0 309 902 A2 4/1989

OTHER PUBLICATIONS

U.S. Appl. No. 09/434,823, filed Nov. 5, 1999, now abandoned.
U.S. Appl. No. 12/414,818, filed Mar. 31, 2009, pending.
International Search Report, PCT/US2010/045562, dated Jan. 4, 2011.

* cited by examiner

*Primary Examiner* — Sylvia R MacArthur
(74) *Attorney, Agent, or Firm* — Andrew C. Siminerio

(57) ABSTRACT

A coating apparatus includes non-orthogonal coater geometry to improve coatings on a glass ribbon, and to improve yields of such coatings. The apparatus includes a first arrangement to move the ribbon along a first imaginary straight line through a coating zone provided in a glass forming chamber. The coater has a coating nozzle and an exhaust slot, each have a longitudinal axis. The coating nozzle directs coating vapors toward the coating zone, and the exhaust slot removes vapors from the coating zone. A second arrangement mounts the coater in spaced relation to the path with the coating nozzle and the exhaust slot facing the coating zone. A second imaginary straight line is normal to the longitudinal axis of the coating nozzle, and the first imaginary line and the second imaginary line subtend an angle in the range of greater than zero degrees to 90 degrees.

13 Claims, 7 Drawing Sheets

NON-ORTHOGONAL COATER GEOMETRY FOR IMPROVED COATINGS ON A SUBSTRATE

BACKGROUND OF THE INVENTION

1. Field of the Invention

This invention relates to a coating apparatus having a non-orthogonal coater geometry to improve coatings on a substrate, and more particularly, to position coating nozzles of a chemical vapor deposition ("CVD") coater relative to the surface of a glass ribbon such that the direction of flow of coating vapors from the coating nozzles and the direction of movement of the glass ribbon subtend an angle measured in either a clockwise or counter-clockwise direction relative to the flow of the coating vapors or the direction of movement of the glass ribbon that is greater than zero degrees and less than ninety degrees.

2. Discussion of the Technology

Environmental coating layers are applied to a glass surface to selectively control the transmission of ultraviolet radiation, visible light, and/or infrared energy through the glass. One of the coating processes for depositing the environmental coating layers is known in the art as chemical vapor deposition ("CVD") coating process. The CVD coater apparatus in general includes a pair of spaced gas curtain inlet slots or nozzles having one or more coating areas between the gas curtain slots and facilities to exhaust the coating area. Each of the coating areas includes a coating nozzle or slot between a pair of spaced exhaust slots or nozzles. CVD coaters having two or more coating areas usually have an exhaust slot between and distanced from adjacent coating nozzles to provide an exhaust slot on both sides of the coating nozzles. The coating nozzles and exhaust slots each have an elongated shaped outlet opening across the width of the coater.

A continuous glass ribbon moves under the coating nozzles and exhaust slots of the CVD coater as the coating vapors move through the coating nozzles and over the surface of the glass ribbon toward and into the exhaust slots. The coater can be mounted in a glass forming chamber, e.g. but not limiting to the discussion, as taught in U.S. Pat. Nos. 4,853,257 and 5,356,718, in which instance the glass ribbon is moved along a path in a downstream direction toward the exit end of the glass forming chamber, or the coater can be mounted between the exit end of a glass forming chamber and the entrance end of a glass annealing lehr, e.g. but not limiting to the discussion as taught in U.S. Pat. Nos. 4,584,206 and 4,900,110, in which instance the glass ribbon is moved along a path in a downstream direction toward the entrance end of the glass annealing lehr. U.S. Pat. Nos. 4,584,206; 4,853,257; 4,900,110, and 5,356,718 are hereby incorporated by reference.

Although the presently available CVD coaters and coating processes are commercially acceptable, there are limitations. More particularly and as discussed in more detail in the DETAILED DISCUSSION OF THE INVENTION presented below, particles of debris accumulate on the edges of the inlet slot opening of the coating nozzle and/or the edges of the opening of the exhaust slots. The debris reduces the width of the outlet opening of the coating nozzle and/or exhaust slot, which results in a disruption of flow due to the Bernoulli Effect either reducing or accelerating the flow of the coating vapors through the opening of the coating nozzle and/or exhaust slot. This disruption or reduction in the flow of coating vapors results in a coated layer or film having a coating streak. The options available when coating streaks are observed in the coating include, but are not limited to, removing the debris from the outlet opening of the coating nozzle and/or exhaust slot, and/or salvaging the coated glass on each side of the coating streak and discarding the glass with the coating streak.

As is appreciated by those skilled in the art, stopping the coating operation to clean the debris from the opening of the coating nozzle and/or the exhaust slot, and/or discarding glass with the color streaks, are costly expedients to solving the problem. It would be advantageous, therefore, to continue the operation of the coating process while eliminating or minimizing the impact of the debris on the outlet opening of the coating nozzle and/or the exhaust slot on the coating applied to the glass ribbon.

SUMMARY OF THE INVENTION

This invention relates to a vapor deposition coating apparatus including, among other things, a first arrangement to move a substrate along a path in a first direction through a coating zone, wherein the path through the coating zone is represented by a first imaginary straight line; a coater comprising a coating nozzle for directing coating vapors toward the coating zone, and an exhaust slot for removing vapors from the coating zone, wherein the coating nozzle and the exhaust slot are spaced from one another and each have a longitudinal axis, and a second arrangement to mount the coater in spaced relation to the path with the coating nozzle and the exhaust slot facing the coating zone, wherein a second imaginary straight line normal to the longitudinal axis of the coating nozzle and/or exhaust slot and the first imaginary line subtend an angle in the range of greater than zero degrees to 90 degrees.

This invention further relates to a chemical vapor deposition coater including, among other things, a housing having a major surface; a first wall and an opposite second wall, and a center line extending from the first wall to the second wall; slit opening of a coating nozzle at the major surface of the housing, slit opening of a first exhaust slot at the major surface of the housing between the first wall of the housing and the opening of the coating nozzle, and slit opening of a second exhaust slot at the major surface of the housing between the second wall of the housing and the opening of the coating nozzle, wherein the slit opening of the coating nozzle, the slit opening of the first exhaust and the slit opening of the second exhaust slot each have a longitudinal axis, and the longitudinal axis of the opening of the coating nozzle and the center line of the housing subtends an angle that is greater than zero degrees and less than 90 degrees, and an arrangement for providing a vaporized coating mixture in gaseous form and moving the vapors through the housing and through the opening of the coating nozzle.

This invention still further relates to a method of depositing a coating on a substrate moving along a path through a coating zone by, among other things, moving a substrate through the coating zone in a first straight direction, and directing coating vapors toward the surface of the substrate as it moves through the coating zone, wherein lines of flow of the coating vapors over the surface of the substrate are in a second direction, wherein the first direction and the second direction subtend an angle in the range of greater than zero and less than 90 degrees.

This invention also relates to a coated article made by the practice of the method of this invention.

BRIEF DESCRIPTION OF THE DRAWINGS

FIG. 5 shows the position of the coating nozzles, the exhaust slots and the gas curtain nozzles of the coater.

DETAILED DESCRIPTION OF THE INVENTION

Figure 1:
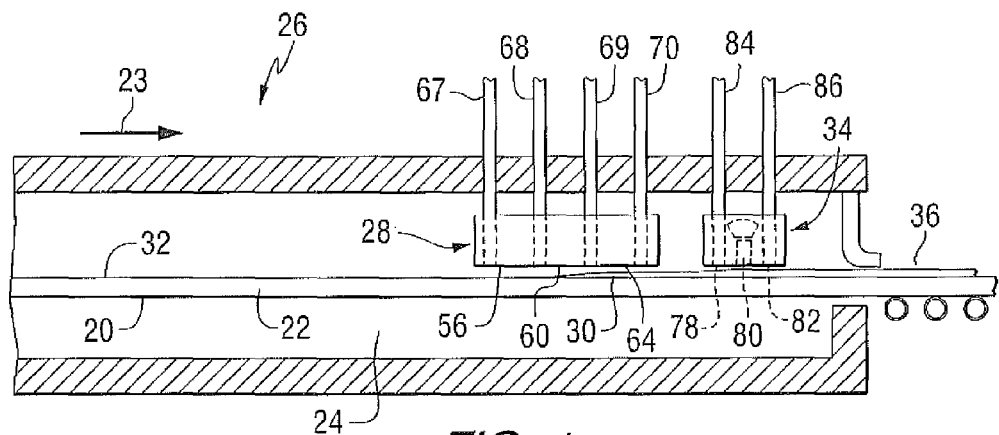
FIG. 1 is a partial cross sectional side view of a glass forming chamber having chemical vapor deposition equipment that can be used in the practice of the invention.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the property desired and/or sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between and inclusive of the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the term "moved over", and "positioned over" means moved and positioned on but not necessarily in surface contact with. For example, one surface, article, film or component "moved over" and "positioned over" another surface, article, film or component of an article does not preclude the presence of materials between the surfaces of the articles, or between components of the article, respectively.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

Non-limiting embodiments of the invention will be discussed using a chemical vapor deposition ("CVD") coating process to deposit a doped or an un-doped tin oxide film or layer over or on a surface of a substrate. As is appreciated, the invention is not limited to the coating process, the substrate, the coating layer and/or the coated product. More particularly, the coating process can be any coating process that applies a coating film or layer from a flow of coating vapor or gas moving over a surface of a substrate, e.g. but not limited to the coating process disclosed in U.S. Pat. No. 5,356,718, and the substrate can be made of any material, e.g. but not limited to clear or colored glass, plastic, metal and wood. The coating layer can be, but is not limited to, a tin oxide film over a glass substrate; a tin oxide film over an anti-iridescence, or color suppression film, or layer over or on a glass substrate; a doped tin oxide film over or on a glass substrate, e.g. but not limited to Sungate® 300 coated glass sold by PPG Industries, Inc., which includes a fluorine doped tin oxide film on a surface of a glass substrate, and a doped tin oxide film over an underlying film over or on a glass substrate e.g. but not limited to Sungate® 500 coated glass sold by PPG Industries, Inc., which includes a fluorine doped tin oxide film on an anti-iridescence film on a surface of a glass substrate. The products that can be made with the coated glass include, but are not limited to coated transparencies, coated bottles, coated glass for low-emissivity windows, thin film photovoltaic applications, electrical touch panels, and electrically heated glass for anti-fog commercial refrigerator doors and for aircraft transparencies.

Figure 2:
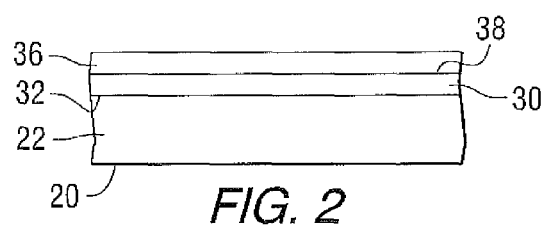
FIGS. 2-4 are side elevated partial views of coated glasses that can be made using the chemical vapor deposition equipment shown in FIG. 1 in accordance to the teachings of the invention.

With reference to FIG. 1, one non-limiting embodiment of the CVD coating apparatus and process of the invention includes surface 20 of a continuous glass ribbon 22 floating on a pool of molten metal 24 and moving in the direction of arrow 23. The pool of molten metal is contained in a glass forming chamber 26, e.g. but not limited to the type disclosed in U.S. Pat. Nos. 3,333,936 and 4,402,722; the disclosures of the patents are hereby incorporated by reference. As the glass ribbon 22 moves under CVD coater 28, e.g. first CVD coater, an anti-iridescence or color suppression film 30 is applied to surface 32 of the glass ribbon 22 (see also FIG. 2). Continued movement of the glass ribbon 22 in the direction of arrow 23 moves the glass ribbon 22 under CVD coater 34, e.g. second CVD coater to apply a fluorine-doped tin oxide film 36 (see FIG. 2) onto surface 38 of the anti-iridescence film 30.

In the preferred practice of the invention, the anti-iridescence or color suppression film 30 is a gradient layer of tin oxide and silicon oxide, and is of the type disclosed in U.S. Pat. Nos. 5,356,718 and 5,863,337, which patents are hereby incorporated by reference. The percent of silicon oxide in the anti-iridescence or color suppression film 30 decreases as the distance from the surface 32 of the glass ribbon 22 increases to provide a gradient anti-iridescence or color suppression film 30 having 100% silicon oxide at the surface 32 of the glass ribbon and 100% tin oxide at the surface 38 of the anti-iridescence or color suppression film 30 (see FIG. 2). For a detailed discussion of the chemistry and application of the anti-iridescence or color suppression film 30 references can be made to U.S. Pat. Nos. 5,356,718 and 5,863,337.

Figure 3:
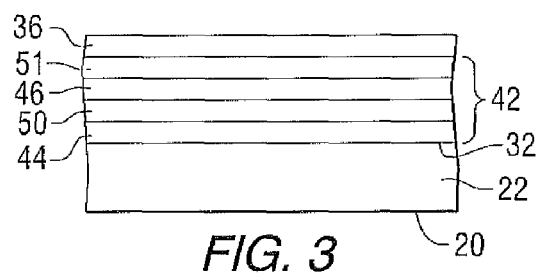
Figure 4:
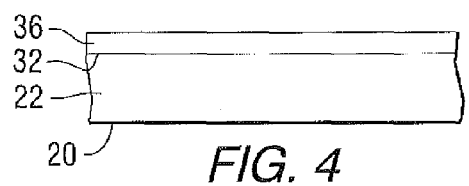

As is appreciated, the invention is not limited to a gradient anti-iridescence or color suppression film, and the invention contemplates an anti-iridescence or color suppression layer having a plurality of homogeneous silicon oxide and tin oxide films. More particularly and not limiting to the invention, shown in FIG. 3 is an anti-iridescence or color suppression layer 42 having tin oxide films 44 and 46 alternating with silicon oxide films 50 and 51. For a detailed discussion of anti-iridescence or color suppression layers having a plurality of homogeneous silicon oxide and tin oxide films reference can be made to U.S. patent application Ser. No. 09/434,823 filed Nov. 5, 1999, which patent application is hereby incorporated by reference. Optionally the anti-iridescence or color suppression film 30 and the layer 42 can be omitted, and the tin oxide or fluorine doped tin oxide film 36 can be applied directly to the surface 32 of the glass ribbon 22 as shown in FIG. 4.

Figure 5:
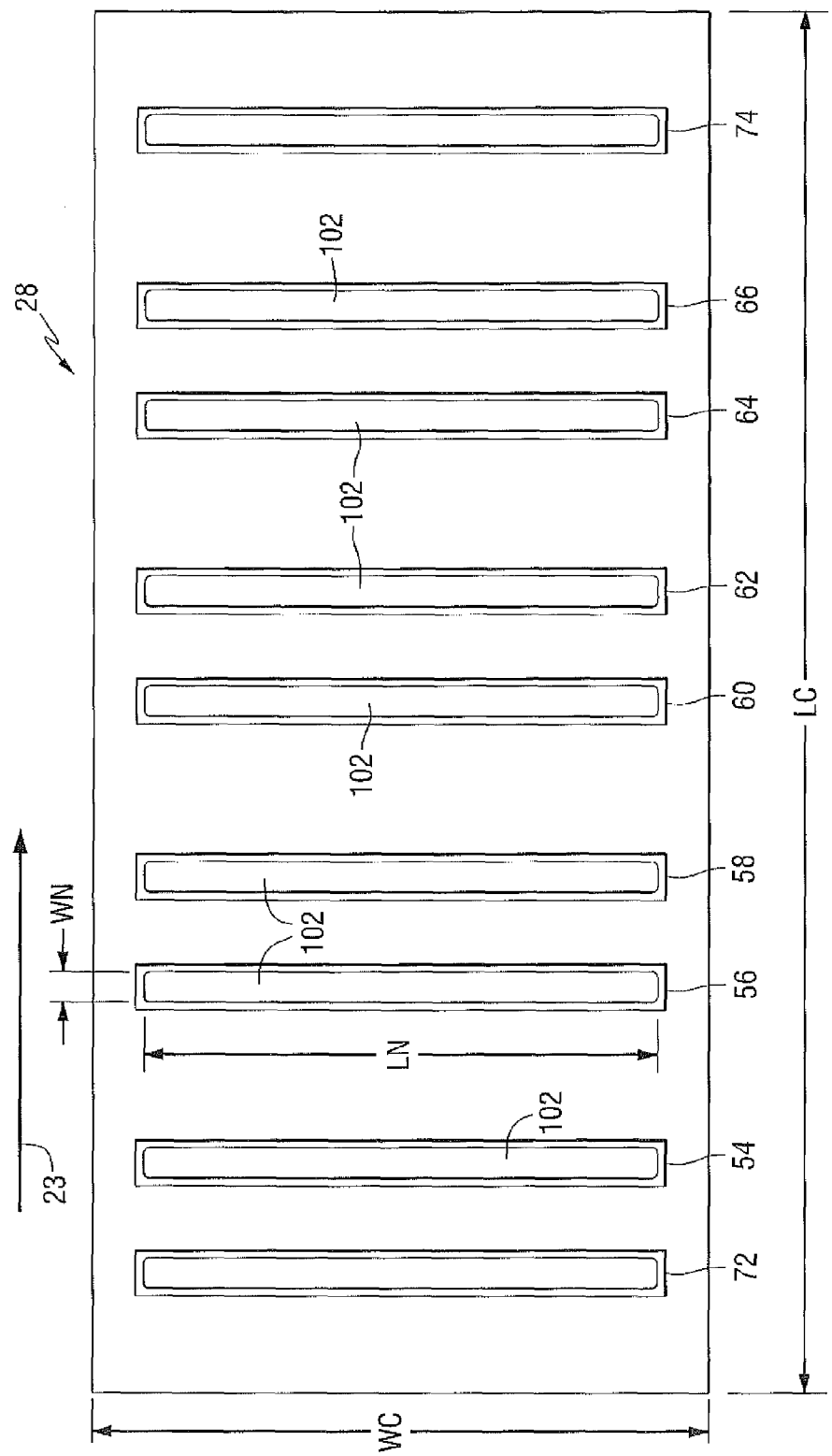
FIG. 5 is a plan view of a surface of a coater that can be used in the practice of the invention.

With reference to FIG. 5, the CVD coating apparatus 28 for applying the anti-iridescence or color suppression film 30 (see FIG. 2), or layer 42 (see FIG. 3) in relationship to the direction of glass flow 26 (see FIG. 1) has an elongated exhaust slot, upstream and downstream of each elongated coating nozzle, e.g. and not limiting to the invention, exhaust slot 54 is upstream of coating nozzle 56; exhaust slot 58 is downstream of the coating nozzle 56 and upstream of the coating nozzle 60; exhaust slot 62 is downstream of the coating nozzle 60 and upstream of the coating nozzle 64, and exhaust slot 66 is downstream of the coating nozzle 64. The effluent streams from the exhaust slots 54, 58, 62 and 66 are moved through conduits 67-70, respectively, to a disposal area and processed in accordance with local, state and federal environmental regulations. The coating apparatus 28 further includes a gas curtain nozzle 72 upstream of outermost upstream exhaust slot, e.g. the exhaust slot 54, and a gas curtain nozzle 74 downstream of outermost downstream exhaust slot, e.g. the exhaust slot 66. An inert gas, e.g. nitrogen is moved through the gas curtain nozzles 72 and 74 to provide an inert gas barrier or curtain to prevent or limit the movement of the coating vapors or gases from the coating nozzles 56, 60 and 64 into the atmosphere of the glass forming chamber 26, and to prevent or limit movement of the atmosphere of the glass forming chamber into the space between the coater and the surface 32 of the glass ribbon 22. As discussed in more detail below, the gas curtain nozzles 72 and 74, the exhaust slots 54, 58, 62, and 66, and the coating nozzles 56, 60, and 64, each have a slit outlet opening, or an elongated outlet opening 102.

With reference to FIG. 1, the CVD coating apparatus 34 for applying the fluorine doped tin oxide film 36 (see FIGS. 2-4) has an exhaust slot 78 upstream of a coating nozzle 80, and an exhaust slot 82 downstream of the coating nozzle 80. The effluent streams moving through the exhaust nozzles 78 and 82 are moved through conduits 84 and 86, respectively, and properly disposed of, e.g. as disclosed in U.S. patent application Ser. No. 12/414,818 filed on Mar. 31, 2009. The coating apparatus 34 also includes a gas curtain nozzle 72 upstream of outermost upstream exhaust slot 78, and a gas curtain nozzle 74 downstream of outermost downstream exhaust slot 82 (see FIG. 6).

Figure 9:
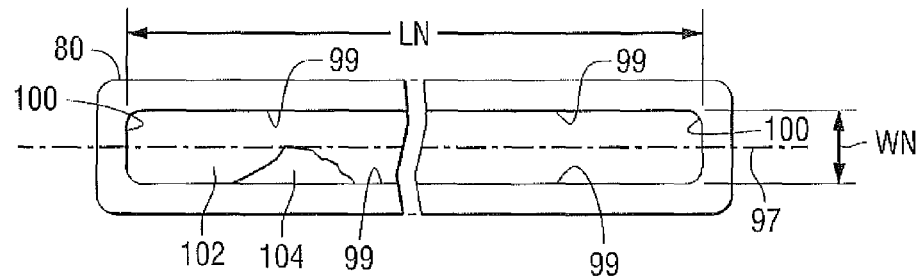
FIG. 9 is a bottom view of a coating nozzle showing debris on the wall of the nozzle opening.

For purposes of clarity, the width of the slit or opening 102 of the coating nozzles 56, 60 and 64; exhaust slots 54, 58, 62 and 66, and gas curtain nozzles 72 and 74, of the coater 28 (see FIGS. 1 and 5) and the coating nozzle 80, the exhaust slots 78 and 82, and gas curtain nozzles 72 and 74 of the coater 34 (see FIGS. 1 and 6) are designated as "WN." The length of the slit or elongated opening 102 of the coating nozzles 56, 60 and 64; exhaust slots 54, 58, 62 and 66, and gas curtain nozzles 72 and 74, of the coater 28 and the coating nozzle 80, exhaust slots 78 and 82, and gas curtain nozzles 72 and 74 of the coater 34 are designated as "LN." The designations "WN" and "LN" are shown only for the coating nozzle 56 and shown only in FIGS. 5 and 9. The width of the coater 28 (see FIG. 5) and the coater 34 (see FIG. 1) are designated as "WC", and the length of the coater 28 (see FIG. 5) and of the coater 34 (see FIG. 1) are designated as "LC." The designations "WC" and "LC" are shown only in FIG. 5 and shown only for the coater 28. As can now be appreciated, the coating nozzles, the exhaust slots and the gas curtain nozzles of the coaters 28 and 34 are nozzles having elongated outlet openings and slots having elongated outlet openings across the width (WC) of their respective coater.

The invention is not limited to the length and width of the outlet opening 102 of the nozzles and the slots, and the width of the outlet openings 102 of the nozzles and slots. The length of the openings of the nozzles and slots can be equal to one another or different from one another. In one non-limiting embodiment of the invention, the width of the opening of the coating nozzles 56, 60 and 64 are equal; the length of the opening of the coating nozzles are equal; the width of the opening of the exhaust slots 54, 58, 62 and 66 are equal; the length of the opening of the exhaust slots are equal; the width of the opening of the gas curtain nozzles 72 and 74 are equal, and the length of the opening of the gas curtain nozzles are equal. In another non-limiting embodiment of the invention, the length of the opening of the gas curtain nozzles 72 and 74 are equal to one another and greater than the length of the opening of the exhaust slots 54, 58, 62 and 66; the length of the opening of exhaust slots are equal to one another and greater than the length of the opening of coating nozzles 56, 60 and 64, and the width of the opening of the gas curtain nozzles, the coating nozzles and the exhaust slots are equal to one another.

The invention is not limited to the number of coating nozzles and exhaust slots for each of the coaters 28 and 34. In the preferred non-limited embodiment of the invention, the coater 28, and the coater 34 can have one or more coating nozzles. More particularly, for making coated glass of the type similar to Sungate® 500 coated glass, the prior art CVD coater used to deposit a gradient anti-iridescent or color suppression film 32 has three coating nozzles and four exhaust slots between gas curtain slots (see FIG. 5), and the prior art CVD coater used to deposit a fluorine doped tin oxide film has seven coating nozzles and eight exhaust slots between gas curtain slots (see FIG. 15).

With continued reference to FIG. 5, in one non-limiting embodiment of the invention, the exhaust slot upstream of a coating nozzle is spaced a greater distance from the coating nozzle than the exhaust slot downstream of the coating nozzle, e.g. and not limiting to the discussion, the exhaust slot 54 upstream of the coating nozzle 56 is spaced a greater distance from the coating nozzle 56 than the exhaust slot 58 downstream of the coating nozzle 56 is spaced from the coating nozzle 56. The invention, however, is not limited to the spacing between the coaters 28 and 34, the coating nozzles, the exhaust slots, and/or the gas curtain nozzles, and those skilled in the art have the knowledge to select the spacing to optimize their coating practice. Further, the invention is not limited to the dimensions of the openings of the coating nozzles, the exhaust slots, and/or the gas curtain nozzles, and those skilled in the art have the knowledge to select the size of the slot and nozzle openings to optimize their coating practice. Still further, the invention is not limited to the coating precursors used in the practice of the invention, nor the resultant composition of the coating. In one non-limiting embodiment of the invention, the coating precursors of the type disclosed in U.S. Pat. Nos. 5,356,718 and 5,599,387, and in U.S. patent application Ser. No. 09/434,823 are used in the practice of the invention.

In one non-limiting embodiment of the invention, as the glass ribbon 22 moves under the coater 28, the coating precursors to apply the anti-iridescence or color suppression film 30 or layer 42 (see FIGS. 2 and 3) over the surface 32 of the glass ribbon 22 (see FIG. 4) are vaporized. The vaporized coating precursors are moved into the coater 28, and then through two or more of the coating nozzles 56, 60 and 64 toward the surface 32 of the glass ribbon 22 to apply the anti-iridescence or color suppression film 30 or layer 42 (see FIGS. 2 and 3) over the surface 32 of the glass ribbon 22 (see FIG. 4). The coating vapors, the reaction vapors and gases are removed from the coating area of the coating nozzles by the exhaust slots 54, 58, 62 and 66. The glass ribbon 22 continues to move along the path 23 and moves under the coater 34. The coating precursors to apply a fluorine doped tin oxide film 36 over the anti-iridescence film 32 or layer 42 are vaporized. The vaporized coating precursors are moved into the coater 34, and then through the coating nozzle 80 toward the film 30 or layer 42 to apply a fluorine doped tin oxide film 36 over the anti-iridescence or color suppression film 32 or layer 42 (see FIGS. 2 and 3). The coating vapors, the reaction vapors and gases are removed from the coating area of the coating nozzle 80 by the exhaust slots 78 and 82. In one non-limiting embodiment of the invention, the length of the coating nozzles and exhaust slots of the coaters 28 and 34 are sized such that the coating nozzles and exhaust slots of the coaters 28 and 34 do not extend beyond the edge 132 (shown in FIG. 14) of the glass ribbon 22 so that the coating vapors are not directed onto the pool of molten metal 24 (see FIG. 1).

Figure 6:
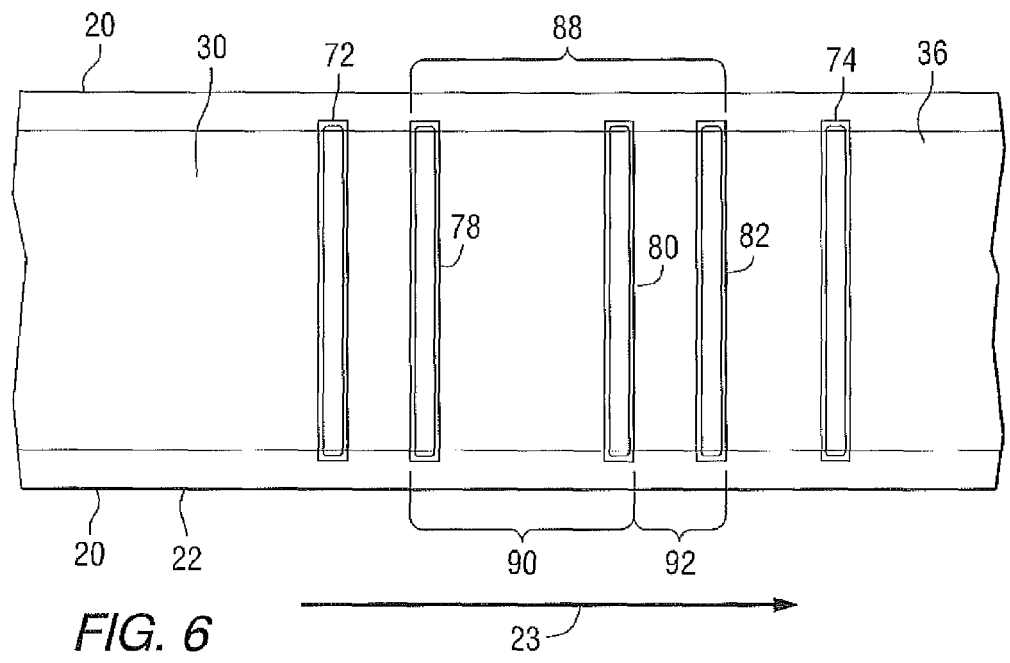
FIG. 6 is a plan view of coating nozzles, gas curtain nozzles and exhaust slots positioned above a glass ribbon as disclosed in the prior art.
Figure 7:
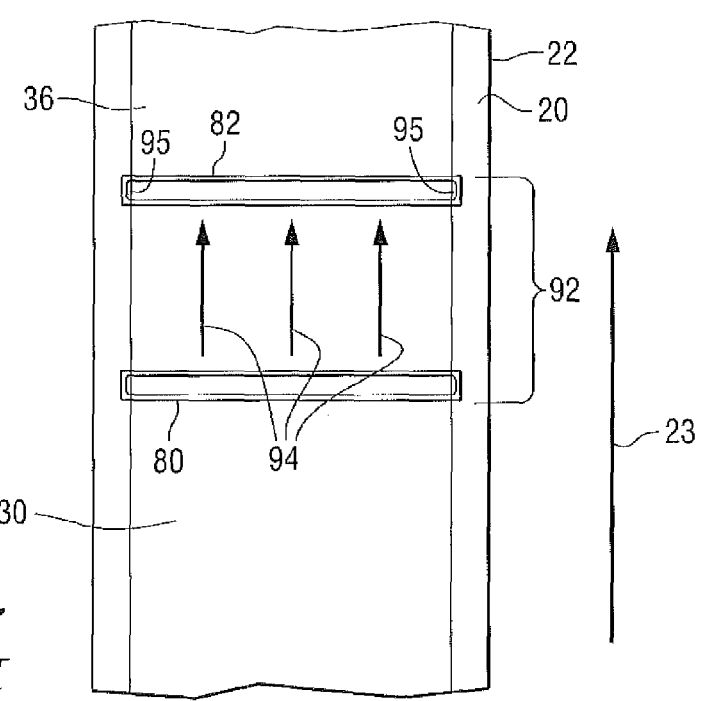
FIG. 7 is a plan view showing the flow of coating vapors from a coating nozzle to an exhaust slot using the arrangement shown in FIG. 6.

The discussion is now directed to the flow path of the vapors or gases moving out of the coating nozzles of the coaters and over the glass ribbon surface 32 (see FIG. 1) and into the exhaust slots on each side of the coating nozzle. In the following discussion, coating zone of the coating nozzle 80 of the coater 34 is discussed with the understanding that the discussion is applicable to the coating zone of the coating nozzles 56, 60 and 64 of the coater 28, and additional coating zones of the coater 34 when present, unless indicated otherwise. The term "coating zone" as used herein means the zone defined by the exhaust slot immediately upstream of a coating nozzle, and the exhaust slot immediately downstream of the coating nozzle. With reference to FIG. 6, the coating zone of the coating nozzle 80 is identified by the number 88 and is between the upstream exhaust slot 78 and the downstream exhaust slot 82. For ease of discussion, the coating zone, e.g. the coating zone 88 has an upstream portion 90 between the coating nozzle 80 and the exhaust slot 78, and a downstream portion 92 between the coating nozzle 80 and the exhaust slot 82. For a better appreciation of the invention, the coating activity of the downstream portion 92 of the coating zone 88 is discussed with the understanding that the discussion is applicable to the upstream portion 90 unless indicated otherwise. As can be appreciated, when considering the upstream portion 90 of the coating zone 88, the coating nozzle 80 is included as shown in FIG. 6, and when considering the downstream portion 92 of the coating zone 88, the coating nozzle 80 is included as shown in FIG. 7.

Figure 8:
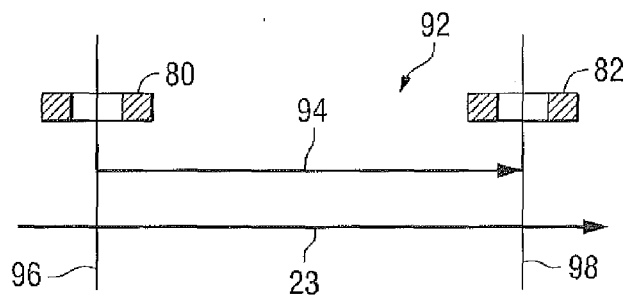
FIG. 8 is a side schematic view of the relationship of the coating nozzle, the exhaust slot, the path of the glass ribbon and the direction of the flow the coating vapors shown in FIG. 7.

The discussion is now directed to the drawback of the present practice of coating a glass ribbon with a CVD coating apparatus. With reference to FIGS. 7 and 8, the flow of the coating vapors in the downstream portion 92 of the coating zone 88 move from the coating nozzle 80 in a direction, e.g. a downstream direction, designated by the arrowed lines 94 to the exhaust slot 82. As is appreciated by those skilled in the art, the flow of the coating vapors is shown by the arrowed lines 94 to designate direction; however, the coating vapors move as a gaseous vapor over the surface 32 of the glass ribbon 20 in the direction of the arrowed lines. The flow of the coating vapors from the coating nozzle 80 to the downstream exhaust slot 82, i.e. passing through the downstream portion 92 of the coating zone 88 (see FIG. 7) is either a laminar flow or a turbulent flow. With specific reference to FIG. 8, there is shown a plane 96 passing through the longitudinal axis 97 of the coating nozzle 80, and a plane 98 passing through the longitudinal axis 97 of the exhaust slot 82 (longitudinal axis 97 shown only for the coating nozzle 80, and only shown in FIG. 9). The planes 96 and 98 are parallel to one another. The direction of the ribbon designated by the arrow 23 and the direction of the flow of the gaseous coating, or the line of coating in the downstream portion 92 of the coating zone 88 designated by the arrowed lines 94 (only one shown in FIG. 8) are normal to the planes 96 and 98.

The drawback with this arrangement is that any reduction in the width of the opening 102 of the coating nozzles due to collection of debris on the coating nozzles reduces the width of the opening 102 of the coating nozzle and results in streaks in the coating. More particularly, the width "WN" of the opening 102 of the coating nozzles (see FIG. 9), of the gas curtain nozzles and of the exhaust slots of the coaters 28 and 34 is measured between inner side surfaces 99 of the nozzles and slots, and the length "LN" of the opening 102 of the coating nozzles, of the gas curtain nozzles and of the exhaust slots of the coaters 28 and 34 is measured between inner end surfaces 100 of the nozzles and slots. The inner side surfaces 99 and the inner end surfaces 100 of the coating nozzle are numbered only in FIG. 9 and are numbered only for the coating nozzle 80.

Figure 10:
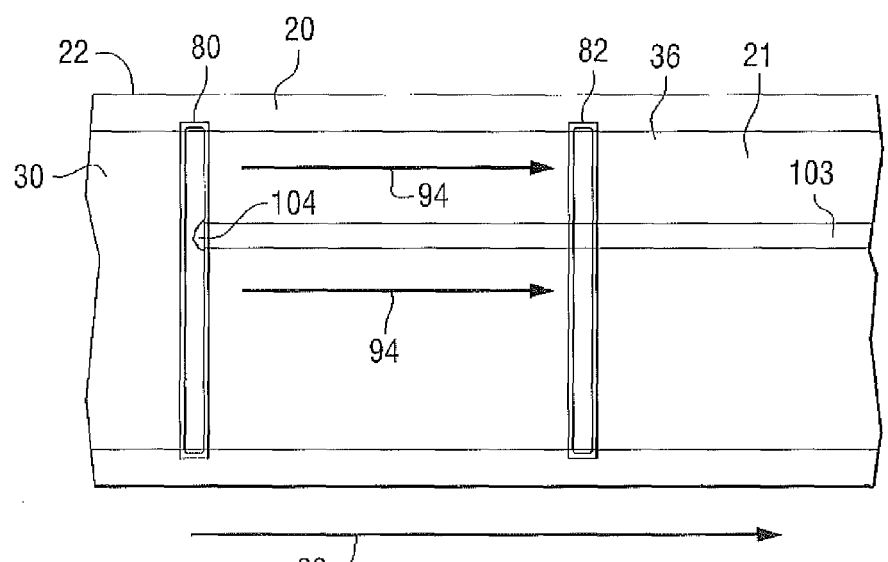
FIG. 10 is a view similar to the view of FIG. 7 showing a coating streak or defect in the coating applied to a surface of a glass ribbon.

Shown in FIG. 10 is a section of the coated glass ribbon 22, having coating streak 103 in the fluorine doped tin oxide film 36. After a study of the coating process, it was concluded that coating streaks, e.g., the coating streak 103 is caused by the collection of debris, e.g., coating debris 104 (see also FIG. 9) on the inner surface of the nozzle opening 102, e.g. but not limiting to the discussion, on the inner side surfaces 99 of the nozzle opening 102. The coating debris 104 decreases the width "WN" of the opening 102 of the coating nozzle 80. With the current geometry of the coating nozzles and exhaust slots (see FIGS. 8 and 9), the longitudinal axis 97 of the coating nozzles and the exhaust slots are aligned perpendicular to the direction 23 of glass travel. It has been observed that across most (about 90%-95%) of the middle portion of the coating nozzle opening 102, the lines 94 of the coating vapors are oriented perpendicular to the longitudinal axis of the coating nozzle and the exhaust slot. At end portions 95 (identified only in FIG. 7) which are each 2.5-5% of the length of the opening of the exhaust slot the flow of the gaseous coating is not expected to be normal to the longitudinal axis of the exhaust slot. Further, the direction of the lines 94 of the coating vapors are generally parallel to the direction 23 of glass travel. This means that the total coating material deposited at a particular location on the glass ribbon is the integral of the deposition rate along the line 94 of the coating vapors at that location. If the chemical supplied to the line 94 of coating vapors is decreased by the debris, e.g. by 10%, then the thickness of the coating film in that location is also reduced by a like amount. Optical modeling and compositional profiling with secondary ion-mass spectroscopy (commonly known as "SIMS") has shown that a 4% reduction in coating thickness will induce a change in the color of the coating by 4 Delta E units as measured using the Hunter 1948 L, a, b color space thus making the defect visible to the unaided eye of a person not skilled in the art. As is appreciated by those skilled in the art, Delta-E is a single number that represents the "distance" in color space that numerically expresses a color difference. In the matter under discussion, the color of the coating streak 103 (see FIG. 10) is one color, and the color of the coating surrounding the streak is another color. The practice of the invention provides a difference between the color of the streak 103 and the color of the coating surrounding the streak of Delta-E less than 4. As is appreciated by those skilled in the art, a Delta-E of less than 4 is not visible to the unaided eye of a person not skilled in the art.

Figure 11:
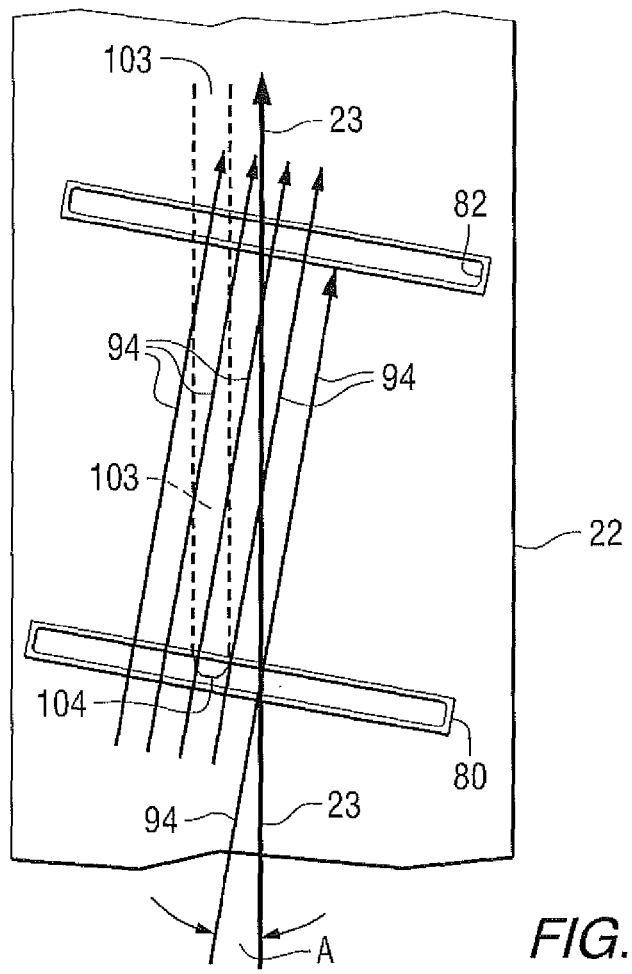
FIG. 11 is a view similar to view of FIG. 7 showing the coating nozzle, exhaust slot and the glass ribbon positioned relative to one another according to the teachings of the invention.

It was further concluded from the study of the coating that the direction of the lines 94 of coating vapors is primarily driven by the pressure differential between the coating nozzle and the exhaust slot of the coating zone. Therefore by orienting the upstream portion 92 of the coating zone 88 such that the direction of the lines 94 of coating vapor is at an angle to the direction 23 of glass travel, e.g. the lines 94 of the coating vapors and the direction 23 of glass travel are not each normal to the longitudinal axis 97 of the coating nozzle and exhaust slot at a particular location on the glass ribbon, the coating defect 103 will cross multiple lines 94 of coating vapor as shown in FIG. 11. In this case, the total thickness at a particular location on the glass ribbon 20 is the integral of the deposition rates of the lines 94 of coating vapor that the location crosses. Thus the impact on coating thickness due to a decrease in the flow along a single or group of lines 94 of coating vapor will be reduced, i.e. an averaging effect will be realized. More particularly, as shown in FIG. 11, the greater the angle A of the lines 94 of coating vapor relative to the direction 23 of the glass ribbon travel, the greater this averaging effect will be on local coating thickness variations and the greater the improvement in color difference.

As can now be appreciated when rotating the lines 94 of coating vapor and the direction 23 of glass travel relative to one another, the openings of the coating nozzles and the exhaust slots are preferably sized such that they do not extend beyond the edge 132 of the glass ribbon. Further as can now be appreciated, the rotation of the lines 94 of coating vapor and the direction 23 of glass travel relative to one another can be in a clockwise direction or in a counter-clockwise direction.

Figure 12:
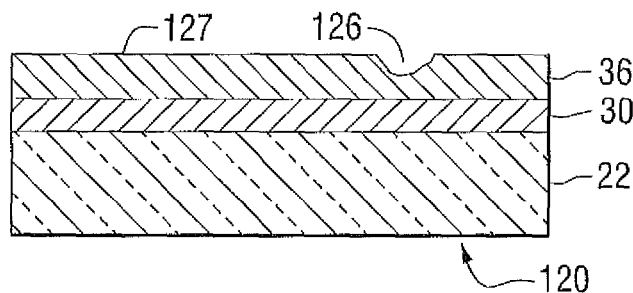
FIG. 12 is a view similar to the view of FIG. 2 showing a defect in the surface of the coating of a coated article made using the coating arrangement shown in FIG. 6.
Figure 13:
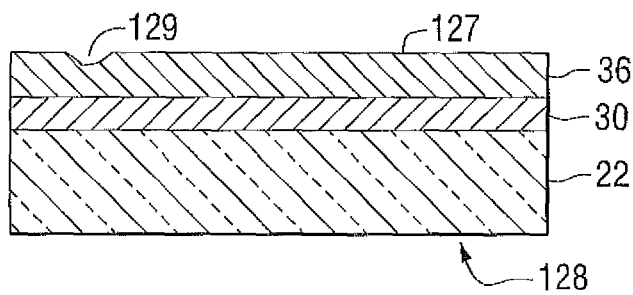
FIG. 13 is a view similar to the view of FIG. 2 showing a defect in the surface of the coating of a coated article made using the coating arrangement of the invention, e.g. but not limited to, the coating arrangement shown in FIG. 11. The defect shown in FIG. 13 is significantly smaller than the defect shown in FIG. 12.

With continued reference to FIG. 11 there is shown the coating nozzle 80 and the exhaust slot 82 mounted relative to the glass ribbon 22 in accordance with the teachings of the invention. The direction 23 of travel of the glass ribbon 20 and the direction of the lines 94 of coating vapors subtend an angle A that is greater than 0 degrees, or 10 degrees or 30 degrees e.g. and not limiting to the invention in one or more ranges selected from the group of greater than 0 and less than 90 degrees, 5 to 70 degrees, greater than 0 to 45 degrees, greater than 0 to 30 degrees, 5-30 degrees, and 10-30 degrees. The direction 23 of travel of the glass ribbon 20 and the direction of the lines 94 of coating vapors can be rotated in a clockwise or counter-clockwise direction relative to one another to subtend the angle A As can now be appreciated, increasing the angle A, increases the number of lines 94 of coating vapor that the coating defect 103 will pass through. Further increasing the angle A decreases the depth of the defect 103, e.g. decreases the value of Delta E. More particularly, FIG. 12 shows a coated glass sheet 120 of the prior art having the anti-iridescence or color suppression film or layer 30 deposited on the glass ribbon 22 and the fluorine doped tin oxide layer 36 over the anti-iridescence film 30. The fluorine doped tin oxide film 30 has a coating defect 126 in the surface 127 of the layer 36 caused by debris on the opening of a coating nozzle, e.g. the debris 104 on the opening 102 of the coating nozzle 80 (see FIG. 9). The depth of the defect 126 measured from the surface 127 is at least 4% of the thickness of the fluorine doped tin oxide film 36 and is visible to the unaided eye of a person not skilled in the art. FIG. 13 shows a coated glass sheet 128 of the present invention having the anti-iridescence or color suppression film or layer 30 deposited on the glass ribbon 22 and a fluorine doped tin oxide layer 36 over the film 30. The direction 23 of the glass ribbon and the lines 94 of coating vapor are set at an angle A of 10 degrees (see FIG. 11). The fluorine doped tin oxide film 36 has a coating defect 129 caused by debris on the opening of a coating nozzle, e.g. the debris 104 of the opening 102 of the coating nozzle 80 (see FIG. 9). The depth of the defect 129 measured from the surface 127 of the coated glass sheet 128 is at less than 4% of the thickness of the fluorine doped tin oxide film 36 and is not visible to the unaided eye of a person not skilled in the art. As used herein the term "unaided eye" means a person having 20-20 eyesight viewing the object without any vision enhancing equipment between the eyes and the object viewed. As can be appreciated, the percent of thickness change is also determined by dividing the thickness of the film, e.g., the thickness of the film 36 into the thickness of the film 36 at the coating defect.

Figure 14:
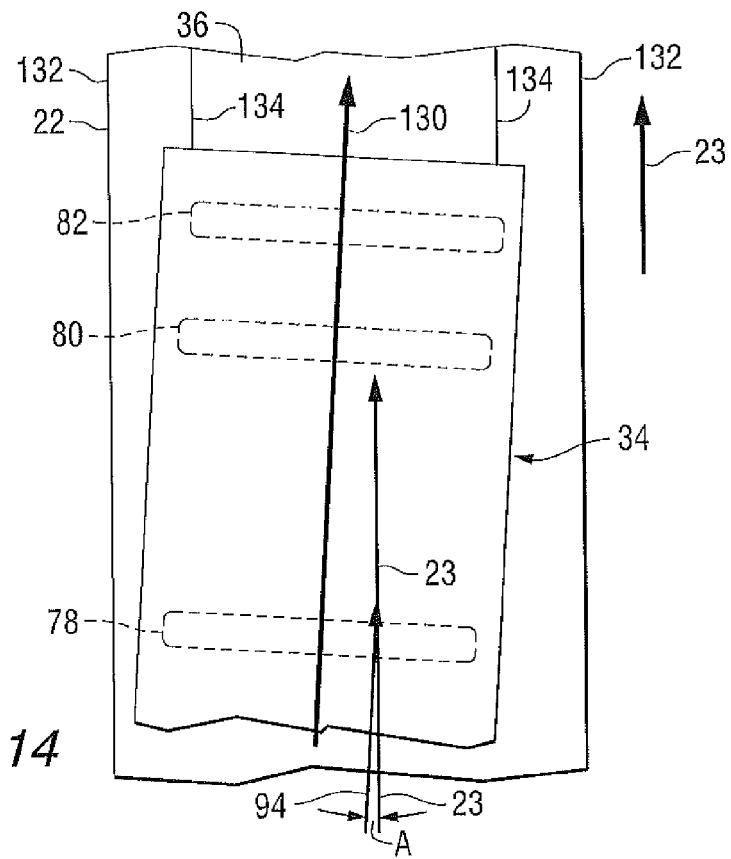
FIGS. 14 and 15 are plan views of coaters positioned relative to a glass ribbon according to non-limiting embodiments of the invention.

As can now be appreciated, the invention is not limited to the manner in which the lines 94 of coating vapor are positioned at an angle A to the direction 23 of the glass ribbon 22. For example and not limiting to the invention, in the instance when the longitudinal axis 97 (see FIG. 9) of the nozzles and slots are normal to longitudinal axis 130 of the coater 34 and the lines 94 of coating vapor (see FIG. 14), the coater 34 is angled relative to the direction 23 of the glass ribbon such that the longitudinal axis 130 of the coater 34 and the lines 94 of the coating vapor each subtend the angle A with the direction 23 of the glass ribbon as shown in FIG. 14. In the event, rotation of a coater, e.g. the coater 34 shown in FIG. 14 results in a wide coating edge, i.e. the distance between edge 132 of the ribbon 22 and edge 134 of the film 36, the length of the opening 102 of the coating nozzle can be increased in any convenient manner, e.g. but not limited to adjusting the end plugs in each mixing chamber to reduce the wide coating edge.

Figure 15:
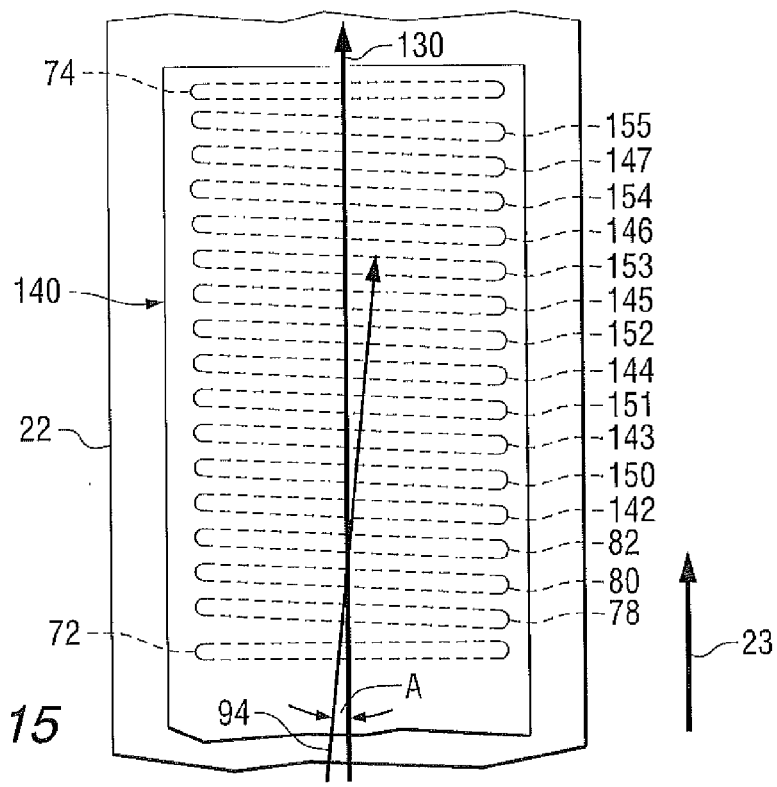

In the instance when the longitudinal axis 97 of the nozzles and slots are parallel to one another and at an angle to the longitudinal axis of the coater, the coater can be positioned relative to the glass ribbon such that the longitudinal axis 130 of the coater is parallel with the direction 23 of glass travel. More particularly, shown in FIG. 15 is a coater 140 having seven coating nozzles designated 80, 142, 143, 144, 145, 146 and 147, and eight exhaust slots designated 78, 82, 150, 151, 152, 153, 154 and 155 between gas curtain nozzles 72 and 74. Longitudinal axis 160 of the coater 140 is parallel to the direction 23 of glass travel, and the longitudinal axis 160 of the coater and the direction 23 of glass travel are each at the angle A with the lines 94 of coating vapor.

The invention contemplates angling the nozzles and slots of the coater 28 in a similar manner as the nozzles and slots of the coater 34 and/or 140 were angled relative to the direction of the glass ribbon as discussed above. In this manner defects caused by debris on the openings of the nozzles and slots of the coater 28 are minimized or eliminated as discussed above for the coater 34. Further, the invention contemplates having the longitudinal axis of the gas curtain slots 72 and 74 parallel to the longitudinal axis 94 of the coating nozzle and/or exhaust slots (see FIG. 5) or having the longitudinal axis of the gas curtain slots 72 and 74 at an angle to the longitudinal axis of the coating nozzles and/or coating exhaust slots (see FIG. 15). Still further, the invention contemplates having the flow of the gaseous coating of one coating zone of a coater angled relative to the direction of glass travel, e.g. at an angle greater than 0 and less than 90 degrees, and having the flow of the gaseous coating of another coating zone of the coater parallel to the direction of glass travel, e.g. at an angle of 0 degrees.

In addition to reducing the Delta E, the practice of the invention provides additional benefits. As discussed above, the total thickness of the coating film is the integral of the deposition rate along or across the lines 94 of coating vapor. If the path of the lines of coating vapor are made longer e.g. by increasing the angle A (see FIG. 11), the thickness of the coating film, e.g. the film 36 (see FIG. 2) will be increased for the same amount of chemical flow. As can now be appreciated, the invention provides for, but is not limited to (1) an increase in chemical utilization, e.g. but not limited to the invention a 1% improvement with a 10 degree increase in the angle A and (2) a reduction in the environmental impact and associated disposal costs of the chemicals of the coating process resulting from by an increase in chemical utilization.

Figure 16:
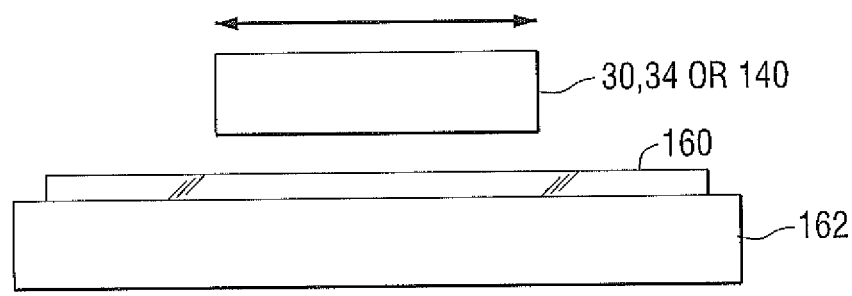
FIGS. 16 and 17 are side views of a coater and glass sheet mounted for movement relative to one another in accordance to the teachings of the invention.
Figure 17:
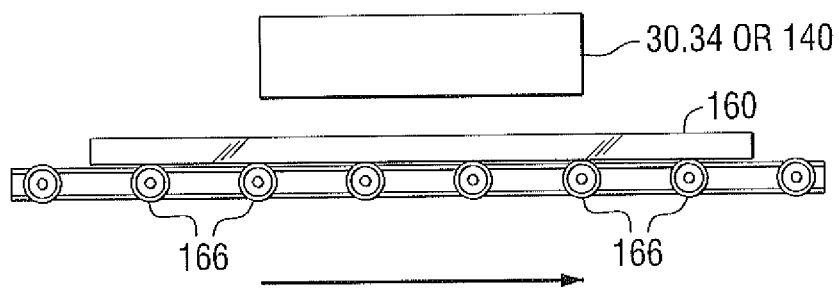

As can now be appreciated by those skilled in the art, the embodiments of the invention are not limited to the embodiments discussed above. More particularly, the longitudinal axis of the nozzles and slots are shown in FIGS. 14 and 15 to be rotated in a clockwise direction relative to the direction 23 of the glass ribbon 22 as viewed in FIGS. 14 and 15 to provide the angle A. The invention is not limited thereto, and the longitudinal axis of the nozzles and slots can be rotated in counterclockwise direction relative to the path of the glass ribbon as viewed in FIGS. 14 and 15. Further, the coater can also be located at the exit end of any furnace, e.g. but not limited to a roller hearth or an oscillating hearth, that heats glass for tempering or heat strengthening. Still further, with reference to FIG. 16, the invention contemplates coating a glass sheet 160 secured on a stationary table 162 in any convenient manner, and the coater, e.g. but not limiting to the discussion the coater 30, 34 or 140 moved over the sheet 162. With reference to FIG. 17, the invention contemplates securing the coater 30, 34 or 140 in position and moving the sheet 160 along conveyor rolls 166 under the coaters. The invention also contemplates simultaneously moving the coater and the glass sheet. Systems for moving glass sheets and/or coaters, and for maintaining coaters and/or glass sheets stationary are will known in the art and no further discussion regarding such systems is deemed necessary.

It will be readily appreciated by those skilled in the art that modifications can be made to the non-limiting embodiments of the invention without departing from the concepts disclosed in the foregoing description. Accordingly, the particular non-limiting embodiments of the invention described in detail herein are illustrative only and are not limiting to the scope of the invention, which is to be given the full breadth of the appended claims and any and all equivalents thereof.

What is claimed is:

1. A method of applying a coating over a surface of a substrate, comprising:
providing a coating zone along a path of travel, wherein a start of the coating zone along the path of travel is defined as Position A and an end of the coating zone along the path of travel is defined as the coating ending position, and the path of travel between the Position A and the coating ending position is along a straight line defined as the substrate path of travel;
dispensing coating vapors from a location adjacent to the Position A toward the coating zone, wherein the coating vapors are dispensed toward the coating zone by moving the coating vapors through a slit opening of a coating nozzle, wherein the coating vapors dispensed through the slit opening of the coating nozzle along a vertical plane passing from longitudinal axis of the coating nozzle toward the coating zone, wherein the vertical plane is normal to the surface of the substrate passing through the coating zone and in facing relationship to the coating nozzle defined as the surface of the substrate be coated, wherein an imaginary straight line is normal to the vertical plane extends from the vertical plane in a downstream direction along the substrate path of travel, and the imaginary line and the substrate path of travel subtend an angle in the range of greater than zero to less than 90 degrees, wherein an open end of the angle formed by the imaginary line and the substrate path of travel faces the upstream direction of the substrate path of travel, and
moving the substrate along the substrate path of travel from the Position A toward the coating ending position with the surface of the substrate to be coated facing the coating vapors to apply a coating to the surface of the substrate to be coated.

2. The method of claim 1 wherein the coating vapors comprise at least one metal oxide.

3. A coated article made by the practice of the method of claim 1.

4. The method according to claim 1, wherein the angle subtended by the imaginary line and the substrate path of travel is in the range of 5-30 degrees.

5. The method according to claim 1 comprising:
exhausting unused coating vapors from the coating zone, wherein the exhausting is performed along an exhaust path of travel, wherein the exhaust path of travel is adjacent to the coating ending position and the exhaust path of travel is parallel to the vertical plane.

6. The method according to claim 5 wherein the unused coating vapors are exhausted from the coating zone by a slit opening of an exhaust slot, wherein slit opening of the exhaust slot has a longitudinal axis, wherein the longitudinal axis of the slot openings of the coating nozzle and the exhaust slot are parallel to one another.

7. The method according to claim 6 wherein the exhaust slot is a first exhaust slot positioned downstream of the coating nozzle along the path of travel, and further comprising a second exhaust slot positioned upstream of the coating nozzle along the path of travel.

8. The method according to claim 6, wherein the slit opening of the coating nozzle is a first slit opening of the coating nozzle and the coating nozzle comprises a second slit and a third slit, and each of the slit openings of the coating nozzle has a longitudinal axis, and the longitudinal axis of the first slit, the second slit and the third slit of the coating nozzle are parallel to one another, and the substrate moves under the three slits of the coating nozzle as the substrate moves through the coating zone along the substrate path of travel.

9. The method according to claim 5 wherein the angle subtended by the imaginary line and the substrate path of travel is in the range of 5-70 degrees, and increasing the angle subtended by the imaginary line and the substrate path of travel decreases Delta E value of the coating applied to the surface of the substrate.

10. The method according to claim 1, wherein the substrate is a glass ribbon and the moving the substrate along the substrate path of travel comprises moving the glass ribbon on a pool of molten metal contained in a chamber, wherein the glass ribbon floats on the pool of molten metal as it moves through the coating zone.

11. The method according to claim 1 wherein the substrate is a heated substrate and the dispensing coating vapors toward the surface of the substrate comprises directing chemical vapors toward the surface of the heated substrate.

12. The method according to claim 11 wherein the heated substrate is a heated glass substrate.

13. The method according to claim 1 wherein increasing the angle subtended by the imaginary line and the substrate path of travel decreases Delta E value of the coating applied to the surface of the substrate.

* * * * *